(12) United States Patent
Kim et al.

(10) Patent No.: US 11,910,581 B2
(45) Date of Patent: Feb. 20, 2024

(54) DISPLAY DEVICE

(71) Applicant: Samsung Display Co., Ltd., Yongin-si (KR)

(72) Inventors: Jinhyoung Kim, Seoul (KR); Hun-Tae Kim, Seoul (KR); Dongho Yoon, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/692,614

(22) Filed: Mar. 11, 2022

(65) Prior Publication Data
US 2022/0377949 A1    Nov. 24, 2022

(30) Foreign Application Priority Data

May 21, 2021 (KR) ........................ 10-2021-0065725

(51) Int. Cl.
| | |
|---|---|
| *H05K 7/20* | (2006.01) |
| *G06F 1/16* | (2006.01) |
| *H01L 25/16* | (2023.01) |
| *H01L 33/64* | (2010.01) |
| *H10K 50/87* | (2023.01) |
| *H10K 59/12* | (2023.01) |

(52) U.S. Cl.
CPC ....... *H05K 7/20963* (2013.01); *G06F 1/1616* (2013.01); *H01L 25/167* (2013.01); *H01L 33/644* (2013.01); *H10K 50/87* (2023.02); *H10K 59/12* (2023.02)

(58) Field of Classification Search
CPC .................................................. H05K 7/20963
See application file for complete search history.

(56) References Cited

U.S. PATENT DOCUMENTS

| | | |
|---|---|---|
| 9,781,826 B2 | 10/2017 | Jeong et al. |
| 10,614,738 B2 | 4/2020 | Aurongzeb et al. |
| 10,930,883 B2 | 2/2021 | Park |

(Continued)

FOREIGN PATENT DOCUMENTS

| | | |
|---|---|---|
| KR | 1020160088519 A | 7/2016 |
| KR | 1020180002047 A | 1/2018 |

(Continued)

OTHER PUBLICATIONS

English translation, KR 20210044337 A (Year: 2021).*

*Primary Examiner* — Mukundbhai G Patel
(74) *Attorney, Agent, or Firm* — CANTOR COLBURN LLP

(57) ABSTRACT

A display device includes a display panel including a first non-folding region, a folding region, and a second non-folding region sequentially arranged along a first direction, a first plate disposed under the display panel, a heat dissipation layer disposed under the first plate, and a first adhesive layer disposed between the first plate and the heat dissipation layer. The first adhesive layer includes a first sub adhesive layer overlapping the first non-folding region, and a second sub adhesive layer overlapping the second non-folding region, the first sub adhesive layer and the second sub adhesive layer are spaced apart from each other in the first direction, and a width of a first gap by which the first sub adhesive layer and the second sub adhesive layer are spaced apart is in a range of about 9 millimeters (mm) to about 12 mm.

20 Claims, 10 Drawing Sheets

(56) References Cited

U.S. PATENT DOCUMENTS

| | | |
|---|---|---|
| 11,245,092 B2 | 2/2022 | Shin et al. |
| 11,245,782 B2 | 2/2022 | Hong |
| 2022/0404877 A1* | 12/2022 | Sakamoto ............. G06F 1/1656 |

FOREIGN PATENT DOCUMENTS

| | | | |
|---|---|---|---|
| KR | 1020180062271 A | | 6/2018 |
| KR | 1020190124844 A | | 11/2019 |
| KR | 1020200077931 A | | 7/2020 |
| KR | 1020200097850 A | | 8/2020 |
| KR | 20210044337 | * | 4/2021 |

* cited by examiner

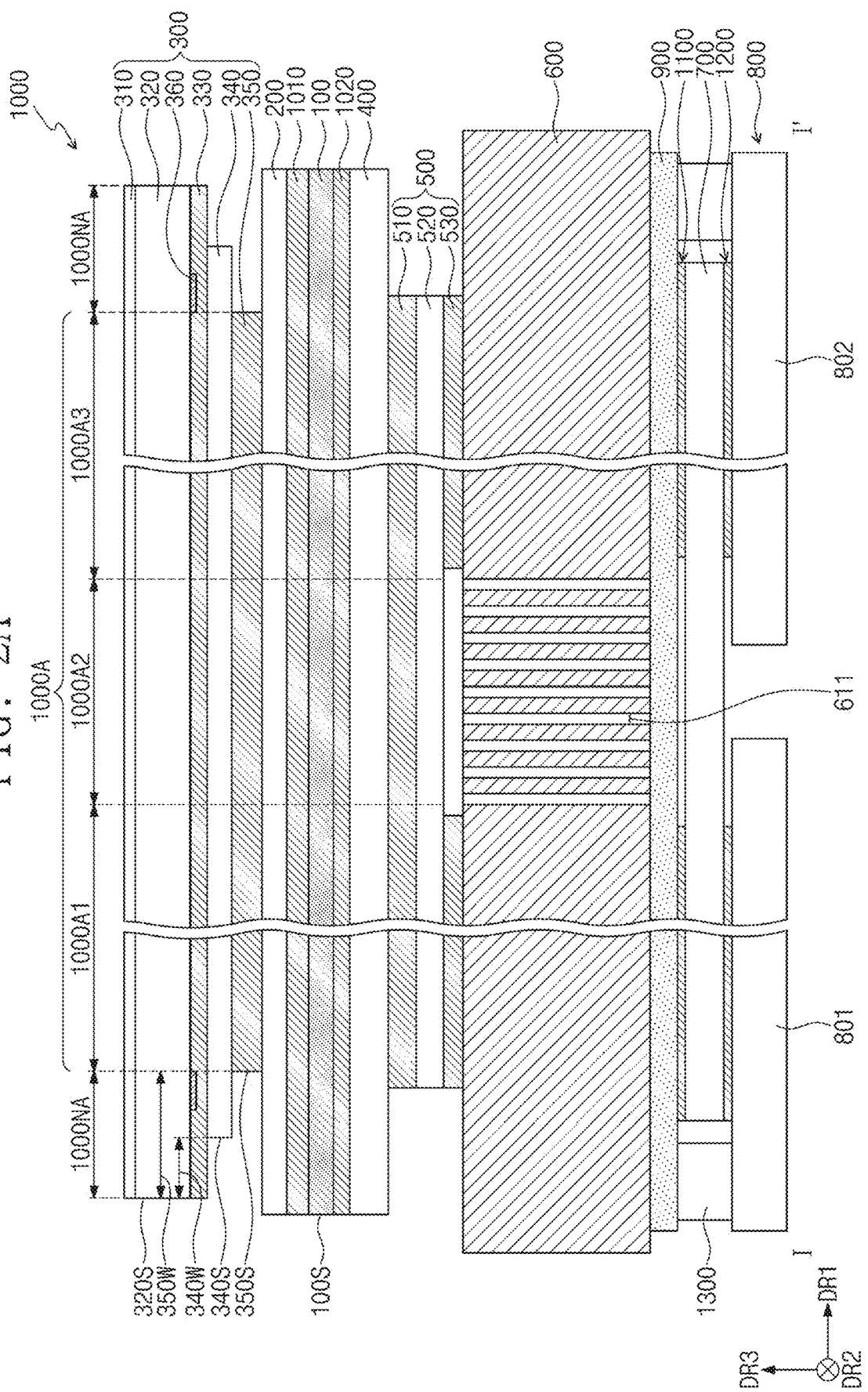

DISPLAY DEVICE

This application claims priority to Korean Patent Application No. 10-2021-0065725, filed on May 21, 2021, and all the benefits accruing therefrom under 35 U.S.C. § 119, the content of which in its entirety is herein incorporated by reference.

BACKGROUND

1. Field

The disclosure herein relates to a display device, and more particularly, to a display device with improved folding characteristics.

2. Description of the Related Art

A display device typically includes an active region activated in response to an electrical signal. A display device may sense an input applied from the outside via an active region, and simultaneously display various images to provide a user with information. Recently, as display devices having various shapes are developed, active regions having various shapes are being implemented.

SUMMARY

Embodiments of the disclosure provides a display device having improved heat dissipation characteristics and folding characteristics.

An embodiment of the invention provides a display device including: a display panel including a first non-folding region, a folding region, and a second non-folding region, which are sequentially arranged along a first direction; a first plate disposed under the display panel; a heat dissipation layer disposed under the first plate; and a first adhesive layer disposed between the first plate and the heat dissipation layer, where the first adhesive layer includes a first sub adhesive layer overlapping the first non-folding region, and a second sub adhesive layer overlapping the second non-folding region, the first sub adhesive layer and the second sub adhesive layer are spaced apart from each other in the first direction, and a width of a first gap, by which the first sub adhesive layer and the second sub adhesive layer are spaced apart, in the first direction is in a range of about 9 millimeters (mm) to about 12 mm.

In an embodiment, the display device may further include: a second plate disposed under the heat dissipation layer; and a second adhesive layer disposed between the heat dissipation layer and the second plate.

In an embodiment, the first plate may include a plate-folding portion in which a plurality of openings overlapping the folding region are defined, and a first width of the plate-folding portion in the first direction may be smaller than the width of the first gap.

In an embodiment, the first width may be smaller than the width of the first gap by a distance in a range of about 0.5 mm to about 3 mm.

In an embodiment, the first width may be in a range of about 7 mm to about 9 mm.

In an embodiment, the display device may further include a cover layer disposed between the first plate and the first adhesive layer, wherein the cover layer may cover the plurality of openings.

In an embodiment, the display device may further include a step compensation layer disposed between the cover layer and the second plate, and spaced apart from the heat dissipation layer in the first direction.

In an embodiment, the second plate may include a first sub plate overlapping the first non-folding region, and a second sub plate overlapping the second non-folding region, and the first sub plate and the second sub plate may be spaced apart in the first direction.

In an embodiment, the second adhesive layer may include a third sub adhesive layer disposed between the heat dissipation layer and the first sub plate, and a fourth sub adhesive layer disposed between the heat dissipation layer and the second sub plate, and the third sub adhesive layer and the fourth sub adhesive layer may be spaced apart from each other by a second gap in the first direction.

In an embodiment, a width of the second gap in the first direction may be greater than the width of the first gap.

In an embodiment, a width of the second gap in the first direction may be substantially the same as the width of the first gap.

In an embodiment, a third gap between the first sub plate and the second sub plate may be smaller than the first gap.

In an embodiment, the first adhesive layer may be in contact with a lower surface of the first plate and an upper surface of the heat dissipation layer, and the second adhesive layer may be in contact with a lower surface of the heat dissipation layer and an upper surface of the second plate.

In an embodiment, the display device may further include: an anti-reflective layer disposed on the display panel; and a protective film disposed under the display panel.

In an embodiment, the heat dissipation layer may include a first heat dissipation portion which overlaps the first non-folding region, a second heat dissipation portion which overlaps the folding region, and of which a part is bent, and a third heat dissipation portion which overlaps the second non-folding region.

In an embodiment of the invention, a display device includes: a display panel including a first non-folding region, a folding region, and a second non-folding region, which are sequentially arranged along a first direction; a first plate disposed under the display panel; a heat dissipation layer disposed under the first plate; and a first adhesive layer disposed between the first plate and the heat dissipation layer, where the first adhesive layer includes a first sub adhesive layer overlapping the first non-folding region, and a second sub adhesive layer overlapping the second non-folding region, the first plate includes a plate-folding portion in which a plurality of openings overlapping the folding region are defined, the first sub adhesive layer and the second sub adhesive layer are spaced apart from each other by a first gap in the first direction, and a first width of the plate-folding portion in the first direction is smaller than a width of the first gap in the first direction by a distance in a range of about 0.5 mm to about 3 mm.

In an embodiment, the display device may further include: a second plate disposed under the heat dissipation layer; and a second adhesive layer disposed between the heat dissipation layer and the second plate.

In an embodiment, the second plate may include a first sub plate overlapping the first non-folding region, and a second sub plate overlapping the second non-folding region, where the first sub plate and the second sub plate may be spaced apart from each other in the first direction.

In an embodiment, the second adhesive layer may include a third sub adhesive layer disposed between the heat dissipation layer and the first sub plate, and a fourth sub adhesive layer disposed between the heat dissipation layer and the second sub plate, where the third sub adhesive layer and fourth sub adhesive layer may be spaced apart from each other by a second gap in the first direction, and the first width may be smaller than a width of the second gap in the first direction by a distance in a range of about 0.5 mm to about 3 mm.

In an embodiment of the invention, a display device includes: a display panel including a first non-folding region, a folding region, and a second non-folding region sequentially arranged along a first direction; a first plate disposed under the display panel; a heat dissipation layer disposed under the first plate; and a first adhesive layer disposed between the first plate and the heat dissipation layer, where the first adhesive layer includes a first sub adhesive layer overlapping the first non-folding region, and a second sub adhesive layer overlapping the second non-folding region, the first plate includes a plate-folding portion in which a plurality of openings overlapping the folding region are defined, the first sub adhesive layer and the second sub adhesive layer are spaced apart from each other by a first gap in the first direction, and a first width of the plate-folding portion in the first direction is in a rage of about 75% to about 90% of a width of the first gap in the first direction.

BRIEF DESCRIPTION OF THE FIGURES

The above and other features of the invention will become more apparent by describing in further detail embodiments thereof with reference to the accompanying drawings, in which:

FIGS. 2A and 2B are cross-sectional views of a display device according to an embodiment of the invention;

DETAILED DESCRIPTION

Figure 1A:
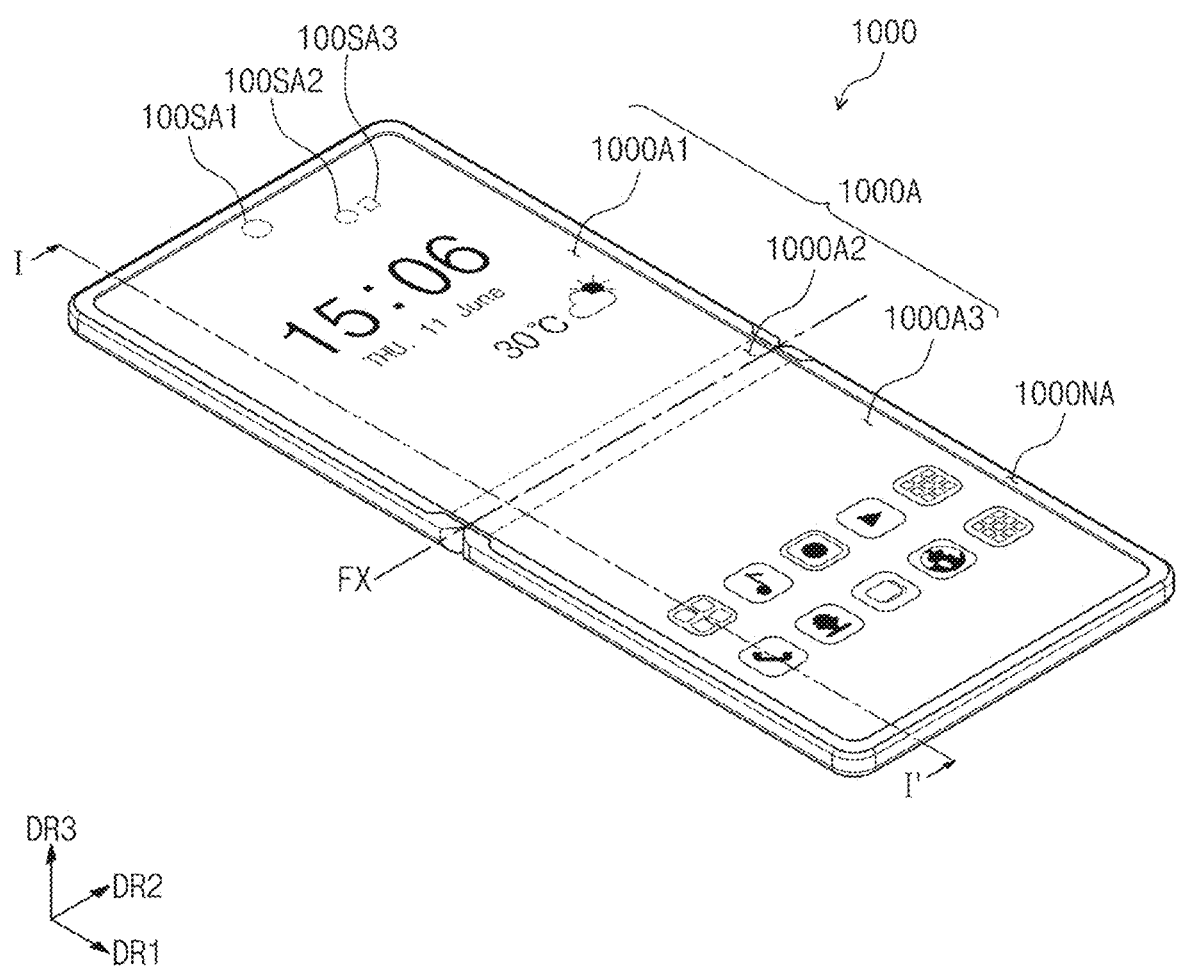
FIG. 1A is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, when a component (or region, layer, portion, etc.) is referred to as "on", "connected", or "coupled" to another component, it means that it is placed/connected/coupled directly on the other component or a third component can be disposed between them.

The same reference numerals refer to the same elements. In addition, in the drawings, thicknesses, ratios, and dimensions of components are exaggerated for effective description of technical content.

Terms such as first and second may be used to describe various components, but the components should not be limited by the terms. These terms are only used for the purpose of distinguishing one component from other components. For example, without departing from the scope of the invention, a first component may be referred to as a second component, and similarly, a second component may be referred to as a first component.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Herein, "directly in contact" may mean that there is no layer, film, region, plate, etc. added between a portion such as a layer, film, region, or plate and another portion. For example, "direct contact" may mean placing two layers or two members without using an additional member such as an adhesive member therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used in this specification have the same meaning as commonly understood by one of ordinary skill in the art to which this invention belongs. In addition, terms such as terms defined in commonly used dictionaries should be interpreted as having a meaning consistent with the meaning having in the context of the related technology, and should not be interpreted as too ideal or too formal unless explicitly defined here.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
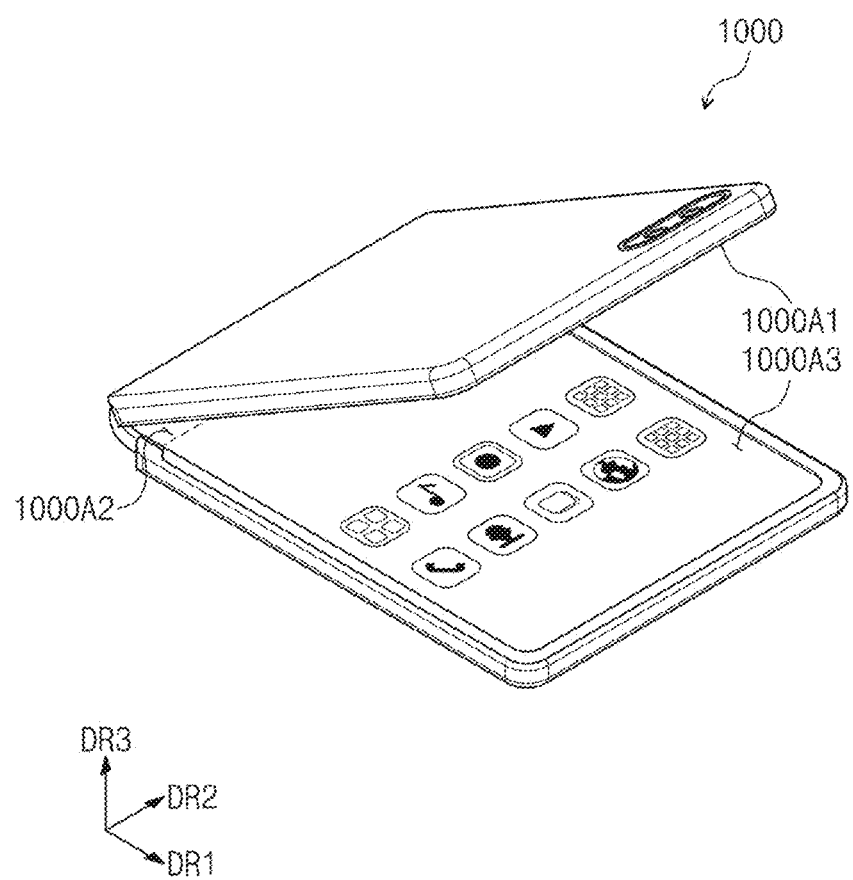
FIG. 1B is a perspective view of a display device according to an embodiment of the invention.

FIG. 1A is a perspective view of a display device according to an embodiment of the invention. FIG. 1B is a perspective view of a display device according to an embodiment of the invention. FIG. 1A illustrates a state in which a display device 1000 is unfolded, and FIG. 1B illustrates a state in which the display device 1000 is folded.

Referring to FIGS. 1A and 1B, an embodiment of the display device 1000 may be activated in response to an electrical signal. In an embodiment, the display device 1000 may be a mobile phone, a tablet personal computer ("PC"), a car navigation system, a game console, or a wearable device, for example, but an embodiment of the invention is not limited thereto. FIG. 1A illustrates one embodiment where the display device 1000 is a mobile phone.

The display device 1000 may display images through an active region 1000A. In a state in which the display device 1000 is unfolded, the active region 1000A may include a surface defined by a first direction DR1 and a second direction DR2. The thickness direction of the display device 1000 may be parallel to a third direction DR3 crossing the first direction DR1 and the second direction DR2. Accordingly, the front surface (or upper surface) and the rear surface (or lower surface) of each member constituting the display device 1000 may be defined based on the third direction DR3.

The active region 1000A may include a first region 1000A1, a second region 1000A2, and a third region 1000A3. The second region 1000A2 may be bent with respect to a folding axis FX extending in the second direction DR2. Accordingly, the first region 1000A1 and the third region 1000A3 may be referred to as non-folding regions, and the second region 1000A2 may be referred to as a folding region.

In an embodiment, when the display device 1000 is folded, the first region 1000A1 and the third region 1000A3 may face each other. Accordingly, in a state in which the active region 1000A is completely folded, the active region 1000A may not be exposed to the outside, and this may be referred to as in-folding, for example, but the operation of the display device 1000 is not limited thereto.

In one alternative embodiment of the invention, when the display device 1000 is folded, the first region 1000A1 and the third region 1000A3 may be opposed to each other. Accordingly, in a state in which the display device 1000 is folded, the active region 1000A may be exposed to the outside, and this may be referred to as out-folding.

The display device 1000 may perform only one operation of in-folding or out-folding. Alternatively, the display device 1000 may perform both in-folding and out-folding operations. In such an embodiment, the same region of the display device 1000, for example, the second region 1000A2 may be in-folded and out-folded. Alternatively, one region of the display device 1000 may be in-folded, and another region of the display device 1000 may be out-folded.

FIGS. 1A and 1B illustrate one embodiment where a single folding region and two non-folding regions are defined, but number of folding regions and number of non-folding regions are not limited thereto. In one alternative embodiment, for example, the display device 1000 may include greater than two non-folding regions, and a plurality of folding regions disposed between non-folding regions adjacent to each other.

FIGS. 1A and 1B illustrate one embodiment where the folding axis FX is parallel to the short axis of the display device 1000, but an embodiment of the invention is not limited thereto. In one alternative embodiment, for example, the folding axis FX may extend along the long axis of the display device 1000, for example, along a direction parallel to the first direction DR1. In such an embodiment, the first region 1000A1, the second region 1000A2, and the third region 1000A3 may be sequentially arranged along the second direction DR2.

A plurality of sensing regions 100SA1, 100SA2, and 100SA3 may be defined in the display device 1000. In an embodiment, three sensing regions 100SA1, 100SA2, and 100SA3 may be defined as illustrated in FIG. 1A, but the number of the plurality of sensing regions 100SA1, 100SA2, and 100SA3 is not limited thereto.

The plurality of sensing regions 100SA1, 100SA2, and 100SA3 may include a first sensing region 100SA1, a second sensing region 100SA2, and a third sensing region 100SA3. In one embodiment, for example, the first sensing region 100SA1 may overlap a camera module, and the second sensing region 100SA2 and the third sensing region 100SA3 may overlap a proximity light sensor, but an embodiment of the invention is not limited thereto.

A plurality of electronic modules may respectively receive external inputs delivered through the first sensing region 100SA1, the second sensing region 100SA2, and the third sensing region 100SA3, or may respectively provide outputs through the first sensing region 100SA1, the second sensing region 100SA2, and the third sensing region 100SA3.

The first sensing region 100SA1, the second sensing region 100SA2, and the third sensing region 100SA3 may be included in the active region 1000A. That is, the first sensing region 100SA1, the second sensing region 100SA2, and the third sensing region 100SA3 may display images. In an embodiment, the transmittance of each of the first sensing region 100SA1, the second sensing region 100SA2, and the third sensing region 100SA3 may be higher than the transmittance of the active region 1000A. In such an embodiment, the transmittance of the first sensing region 100SA1 may be higher than the transmittance of the second sensing region 100SA2, and the transmittance of the third sensing region 100SA3, but an embodiment of the invention is not limited thereto. In an embodiment, at least one selected from the first sensing region 100SA1, the second sensing region 100SA2, or the third sensing region 100SA3 may be provided not in the active region 1000A but in a peripheral region 1000NA. In an embodiment, at least one selected from the first sensing region 100SA1, the second sensing region 100SA2, or the third sensing region 100SA3 may be provided with an opening.

According to an embodiment of the invention, a portion of a plurality of electronic modules may overlap the active region 1000A, and another portion of the plurality of electronic modules may be surrounded by the active region 1000A. Accordingly, a region in which the plurality of electronic modules are disposed may not be provided in the peripheral region 1000NA around the active region 1000A. As a result, the area ratio of the active region 1000A to the front surface of the display device 1000 may be increased.

Figure 2B:
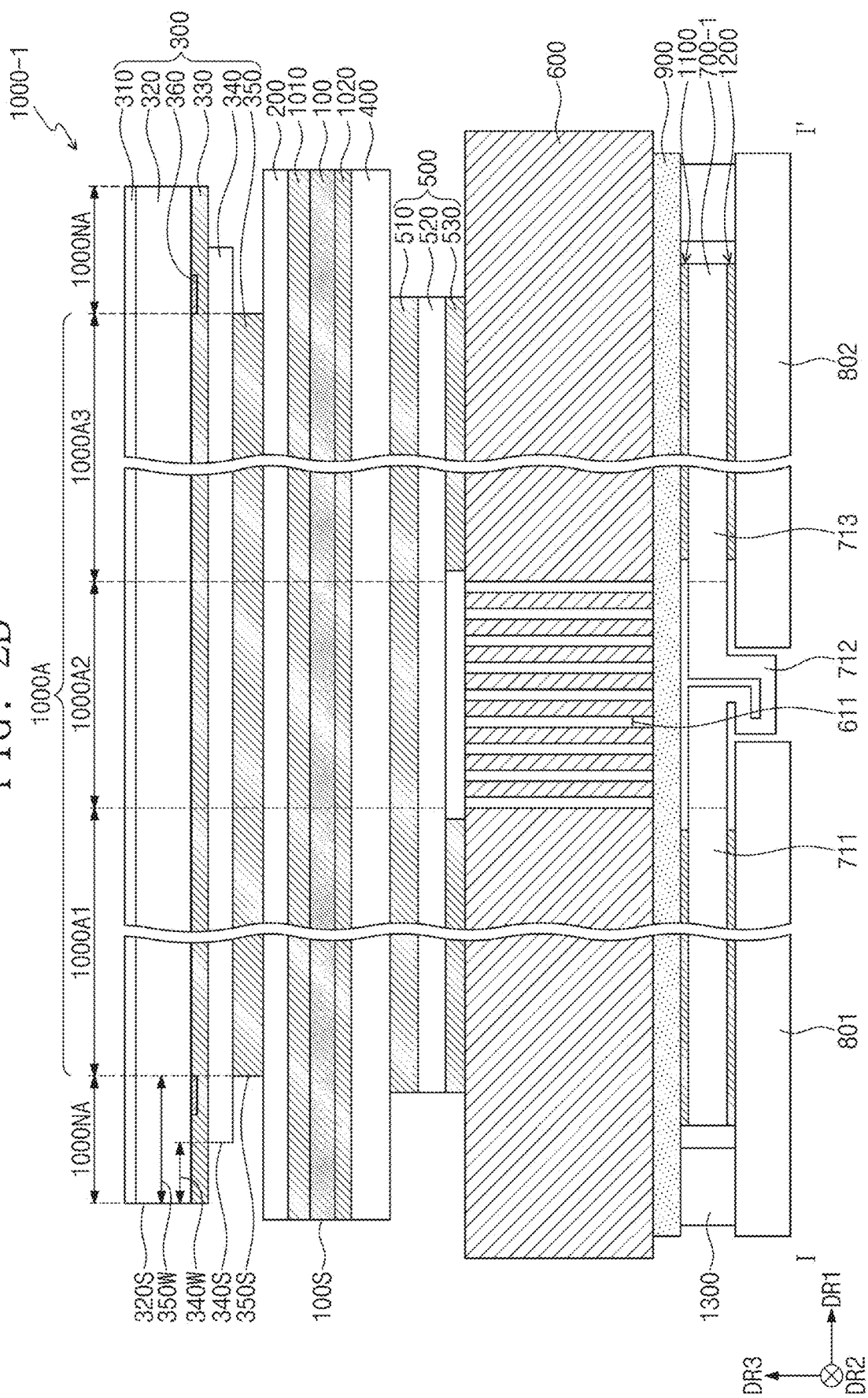
Figure 3:
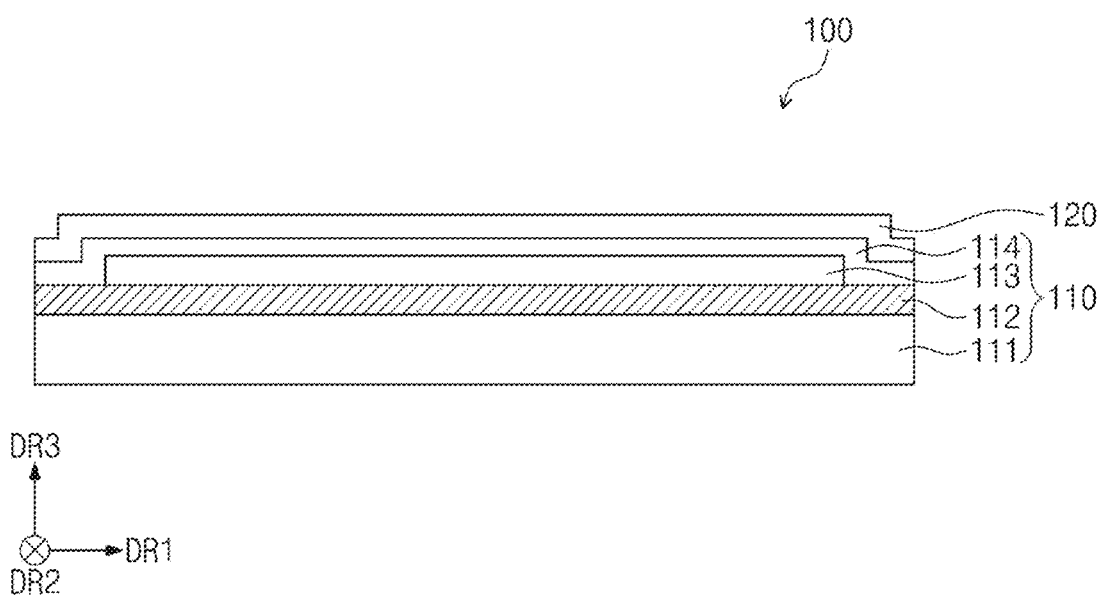
FIG. 3 is a cross-sectional view of a display panel according to an embodiment of the invention.

FIGS. 2A and 2B are cross-sectional views of a display device according to an embodiment of the invention. FIGS. 2A and 2B illustrate cross-sectional views of a display device taken along I-I' of FIG. 1A. FIG. 3 is a cross-sectional view of a display panel according to an embodiment of the invention.

Referring to FIG. 2A, an embodiment of a display device 1000 may include a display panel 100, upper functional layers, and lower functional layers.

Referring to FIG. 3, an embodiment of a display panel 100 may be configured to generate images, and sense an input applied from the outside. In one embodiment, for example, the display panel 100 may include a display layer 110 and a sensor layer 120. The thickness of the display panel 100 may be in a range of about 25 micrometers (μm) to about 35 μm, for example, about 30 μm, but the thickness of the display panel 100 is not limited thereto.

The display layer 110 may be configured to generate images substantially. The display layer 110 may be a light-emitting display layer, for example, an organic light-emitting display layer, a quantum dot display layer, or a micro-light emitting diode ("LED") display layer.

The display layer 110 may include a base layer 111, a circuit layer 112, a light-emitting element layer 113, and a sealing layer 114.

The base layer 111 may include a synthetic resin layer. The synthetic resin layer may include a thermosetting resin. The base layer 111 may have a multi-layered structure. In one embodiment, for example, the base layer 111 may have a three-layered structure of a synthetic resin layer, an adhesive layer, and a synthetic resin layer. In such an embodiment, the synthetic resin layer may be a polyimide-based resin layer, but the material thereof is not specially limited thereto. The synthetic resin layer may include at least one selected from an acrylic resin, a methacrylic resin, a polyisoprene-based resin, a vinyl-based resin, an epoxy-based resin, a urethane-based resin, a cellulose-based resin, a siloxane-based resin, a polyamide-based resin, and a perylene-based resin. In an embodiment, the base layer 111 may include a glass substrate, an organic/inorganic composite material substrate, etc.

The circuit layer 112 may be disposed on the base layer 111. The circuit layer 112 may include an insulating layer, a semiconductor pattern, a conductive pattern, a signal line, etc. In an embodiment, an insulating layer, a semiconductor layer, and a conductive layer may be formed on the base layer 111 through a process such as coating and deposition, and then may be selectively patterned by performing a photolithography process multiple times. Thereafter, a semiconductor pattern, a conductive pattern, and a signal line included in the circuit layer 112 may be formed.

The light-emitting element layer 113 may be disposed on the circuit layer 112. The light-emitting element layer 113 may include a light-emitting element. In one embodiment, for example, the light-emitting element layer 113 may include an organic light-emitting material, a quantum dot, a quantum rod, or a micro-LED.

The sealing layer 114 may be disposed on the light-emitting element layer 113. The sealing layer 114 may include an inorganic layer, an organic layer, and an inorganic layer sequentially stacked, but layers constituting the sealing layer 114 are not limited thereto.

The inorganic layers may protect the light-emitting element layer 113 from moisture and oxygen, and the organic layer may protect the light-emitting element layer 113 from foreign matters such as dust particles. The inorganic layers may include a silicon nitride layer, a silicon oxynitride layer, a silicon oxide layer, a titanium oxide layer, an aluminum oxide layer, or the like. The organic layer may include an acrylic organic layer, but an embodiment of the invention is not limited thereto.

The sensor layer 120 may be disposed on the display layer 110. The sensor layer 120 may sense an external input applied from the outside. The external input may be a user's input. The user's input may include various types of external inputs such as a portion of a user's body, light, heat, a pen, or pressure.

In an embodiment, the sensor layer 120 may be formed on the display layer 110 through continuous processes. In such an embodiment, the sensor layer 120 may be expressed as being disposed directly on the display layer 110. Being disposed directly may mean that a third component is not disposed between the sensor layer 120 and the display layer 110. That is, a separate adhesive member may not be disposed between the sensor layer 120 and the display layer 110.

Alternatively, the sensor layer 120 may be connected to the display layer 110 through an adhesive member. The adhesive member may include a typical bonding agent or adhesive.

Referring back to FIG. 2A, the upper functional layers may be disposed on the display panel 100. In one embodiment, for example, the upper functional layers may include an anti-reflective member 200 and an upper member 300.

The anti-reflective member 200 may be referred to as an anti-reflective layer. The anti-reflective member 200 may reduce the reflectance of external light incident from the outside. The anti-reflective member 200 may include a stretchable synthetic resin film. In one embodiment, for example, the anti-reflective member 200 may be provided by dyeing a polyvinyl alcohol ("PVA") film with an iodine compound, but the material constituting the anti-reflective member 200 is not limited thereto. The thickness of the anti-reflective member 200 may be in a range of about 25 μm to about 35 μm, for example, about 31 μm, but the thickness of the anti-reflective member 200 is not limited thereto.

In an embodiment, the anti-reflective member 200 may include color filters. The color filters may have a predetermined arrangement. In the anti-reflective member 200, the arrangement of the color filters may be determined in consideration of light-emitting colors of pixels included in the display layer 110. In an embodiment, the anti-reflective layer may include a black matrix adjacent to the color filters.

In an embodiment, the anti-reflective member 200 may include a destructive interference structure. In one embodiment, for example, the destructive interference structure may include a first reflective layer and a second reflective layer respectively disposed in different layers from each other. In such an embodiment, first reflective light and second reflective light respectively reflected at the first reflective layer and the second reflective layer may be destructively interfered, resulting in a decrease in the reflectance of external light.

The anti-reflective member 200 may be connected to the display panel 100 through a first intermediate adhesive layer 1010. The first intermediate adhesive layer 1010 may include a transparent adhesive material such as a pressure sensitive adhesive ("PSA"), an optically clear adhesive ("OCA"), or an optically clear resin ("OCR"). An adhesive layer to be described below may include a typical bonding agent or adhesive. The thickness of the first intermediate adhesive layer 1010 may be in a range of about 20 µm to about 70 µm, for example, about 50 µm, but the thickness of the first intermediate adhesive layer 1010 is not limited thereto.

In an alternative embodiment of the invention, the first intermediate adhesive layer 1010 may be omitted, and in such an embodiment, the anti-reflective member 200 may be disposed directly on the display panel 100. In such an embodiment, a separate adhesive layer may not be disposed between the anti-reflective member 200 and the display panel 100.

The upper member 300 may be disposed on the anti-reflective member 200. The upper member 300 may include a hard coating layer 310, a protective layer 320, a first upper adhesive layer 330, a window 340, a second upper adhesive layer 350, and a light-blocking pattern 360. Components included in the upper member 300 are not limited to the aforementioned components. At least some of the aforementioned components may be omitted, and other components may be added.

The hard coating layer 310 may be disposed on the outermost surface of the display device 1000. The hard coating layer 310, which is a functional layer for improving the usability characteristics of the display device 1000, may be provided via coating on the protective layer 320. In one embodiment, for example, anti-fingerprint characteristics, anti-pollution characteristics, anti-scratch characteristics, etc., may be improved by the hard coating layer 310.

The protective layer 320 may be disposed under the hard coating layer 310. The protective layer 320 may protect components disposed thereunder. The protective layer 320 may be additionally provided with the hard coating layer 310, an anti-fingerprint layer, etc., to improve characteristics such as chemical resistance and abrasion resistance. The protective layer 320 may include a film having an elastic modulus of about 15 gigapascal (GPa) or less at a room temperature. The thickness of the protective layer 320 may be in a range of about 50 µm to about 70 µm, for example, about 65 µm, but the thickness of the protective layer 320 is not limited thereto. In an alternative embodiment, the protective layer 320 may be omitted. Although not specifically shown, the protective layer 320 may have a structure in which a plurality of films are stacked. The protective layer 320 may include a plurality of synthetic resin films connected (or attached) to each other by an adhesive.

The first upper adhesive layer 330 may be disposed under the protective layer 320. The protective layer 320 and the window 340 may be connected to each other by the first upper adhesive layer 330. The thickness of the first upper adhesive layer 330 may be in a range of about 20 µm to about 50 µm, for example, about 35 µm, but the thickness of the first upper adhesive layer 330 is not limited thereto.

The window 340 may be disposed under the first upper adhesive layer 330. The window 340 may include an optically transparent insulating material. In one embodiment, for example, the window 340 may include a glass substrate or a synthetic resin film. In an embodiment where the window 340 includes a glass substrate, the window 340 may be a thin-film glass substrate having a thickness of about 80 µm or less. In one embodiment, for example, the thickness of the window 340 may be about 31 µm, but the thickness of the window 340 is not limited thereto.

In an embodiment where the window 340 includes a synthetic resin film, the window 340 may include a polyimide film, or a polyethylene terephthalate ("PET") film.

The window 340 may have a multi-layered structure, or a single-layered structure. In one embodiment, for example, the window 340 may include a plurality of synthetic resin films connected by an adhesive, or a glass substrate and a synthetic resin film connected by an adhesive.

The second upper adhesive layer 350 may be disposed under the window 340. The window 340 and the anti-reflective member 200 may be connected to each other by the second upper adhesive layer 350. The thickness of the second upper adhesive layer 350 may be in a range of about 30 µm to about 70 µm, for example, about 50 µm, but the thickness of the second upper adhesive layer 350 is not limited thereto.

In an embodiment of the invention, a sidewall 340S of the window 340 and a sidewall 350S of the second upper adhesive layer 350 may be disposed more inwards than sidewalls of other layers, for example, than a sidewall 100S of the display panel 100, and a sidewall 320S of the protective layer 320. Being disposed more inwards means that being closer to the active region 1000A than other comparison targets.

The positional relation between respective layers may be changed through a folding operation of the display device 1000. According to an embodiment of the invention, since the sidewall 340S of the window 340 is disposed more inwards than the sidewall 100S of the display panel 100 and the sidewall 320S of the protective layer 320, the probability that the sidewall 340S of the window 340 protrudes more than the sidewall 320S of the protective layer 320 may be reduced even when the positional relation between each layer is changed. Accordingly, the probability that an external impact is transmitted through the sidewall 340S of the window 340 may be reduced. As a result, the probability that a crack is generated in the window 340 may be reduced.

A first distance 340W between the sidewall 340S of the window 340 and the sidewall 320S of the protective layer 320 may be a predetermined distance or more. Here, the first distance 340W may mean a distance in a direction parallel to the first direction DR1. In such an embodiment, the first distance 340W may correspond to a distance between the sidewall 340S of the window 340 and the sidewall 320S of the protective layer 320, when viewed on a plane or in a top plan view in the third direction DR3.

The first distance 340W may be in a range of about 180 µm to about 250 µm, for example, about 210 µm, but an embodiment of the invention is not limited thereto. In one embodiment, for example, the first distance 340W may be about 50 µm or more, or may be about µm. As the first distance 340W increases, the protective layer 320 may protrude more than the window 340, and a portion of the protective layer 320 may be bent to be attached to other components, for example, a case. In such an embodiment, as the area of the protective layer 320 increases, the probability that a foreign matter introduced from the upper portion of the protective layer 320 is introduced into the lower portion of the protective layer 320 may be reduced.

In an embodiment, the window 340 and the second upper adhesive layer 350 may be attached to the anti-reflective member 200 through a lamination process. In consideration of a lamination process tolerance, the area of the window 340 and the area of the second upper adhesive layer 350 may be smaller than the area of the anti-reflective member 200. In such an embodiment, the area of the second upper adhesive layer 350 may be smaller than the area of the window 340. In a process for attaching the window 340, pressure may be applied to the second upper adhesive layer 350. The second upper adhesive layer 350 may receive pressure to be stretched in directions parallel to the first direction DR1 and the second direction DR2. Here, the area of the second upper adhesive layer 350 may be smaller than the area of the window 340 so that the second upper adhesive layer 350 does not protrude more than the window 340.

When the first upper adhesive layer 330 and the second upper adhesive layer 350 are attached, the window 340 may not slip in the folding operation of the display device 1000, so that a buckling phenomenon may occur in the window 340. However, according to an embodiment of the invention, the area of the second upper adhesive layer 350 is smaller than the area of the window 340, and thus the first upper adhesive layer 330 may not be attached to the second upper adhesive layer 350, thereby reducing the probability that a foreign matter is attached to the second upper adhesive layer 350.

A second distance 350W between the sidewall 350S of the second upper adhesive layer 350 and the sidewall 320S of the protective layer 320 may be a predetermined distance or more. Here, the second distance 350W may mean a distance in a direction parallel to the first direction DR1. In such an embodiment, the second distance 350W may correspond to a distance between the sidewall 350S of the second upper adhesive layer 350 and the sidewall 320S of the protective layer 320, when viewed on a plane.

The second distance 350W may be about 408 μm, but an embodiment of the invention is not limited thereto. In one embodiment, for example, the second distance 350W may be selected from the range between about 292 μm to about 492 μm, but an embodiment of the invention is not limited thereto.

The light-blocking pattern 360 may be disposed under the protective layer 320. The light-blocking pattern 360 may be provided by being printed on the lower surface of the protective layer 320, and may be covered by the first upper adhesive layer 330. The light-blocking pattern 360 may overlap the peripheral region 1000NA. The light-blocking pattern 360 may be disposed adjacent to the border of the protective layer 320. The light-blocking pattern 360 is a colored layer, and may be formed through a coating process. The light-blocking pattern 360 may include a colored organic material, or an opaque metal, but the material constituting the light-blocking pattern 360 is not limited thereto.

FIG. 2A illustrates one embodiment where the light-blocking pattern 360 is disposed on the lower surface of the protective layer 320, but the position of the light-blocking pattern 360 is not limited thereto. In one embodiment, for example, the light-blocking pattern 360 may be provided on the upper surface of the protective layer 320, the upper surface of the window 340, or the lower surface of the window 340. In an embodiment, the light-blocking pattern 360 may be provided to a plurality of layers. In such an embodiment, a portion of the light-blocking pattern 360 may be provided on the lower surface of the protective layer 320, and another portion of the light-blocking pattern 360 may be provided on the upper surface of the protective layer 320, the upper surface of the window 340, or the lower surface of the window 340.

Although not shown, the upper member 300 may further include an impact-absorbing layer and a lower hard coating layer which are disposed under the second upper adhesive layer 350.

The impact-absorbing layer may be a functional layer for protecting the display panel 100 from an external impact. The impact-absorbing layer may be selected from films having an elastic modulus of about 1 GPa or more at a room temperature. In an alternative embodiment of the invention, the impact-absorbing layer may be omitted.

The lower hard coating layer may be disposed or provided on the surface of the impact-absorbing layer. The impact-absorbing layer may have an irregular surface. The upper surface of the impact-absorbing layer may be in contact with the second upper adhesive layer 350. Accordingly, the irregularities of the upper surface of the impact-absorbing layer may become smooth by the second upper adhesive layer 350, and an optical issue may not occur on the upper surface of the impact-absorbing layer. The lower surface of the impact-absorbing layer may be planarized by the lower hard coating layer. Since the lower hard coating layer covers the irregularities of the lower surface of the impact-absorbing layer, haze which may occur on the lower surface of the impact-absorbing layer may be effectively prevented.

Lower functional layers may be disposed under the display panel 100. In one embodiment, for example, the lower functional layers may include a lower protective film 400, a barrier member 500, a first plate 600, a heat dissipation layer 700, and a second plate 800. Components included in the lower functional layers are not limited to the aforementioned components. At least some of the aforementioned components may be omitted, and other components may be added.

The lower protective film 400 may be connected to the rear surface of the display panel 100 through the second intermediate adhesive layer 1020. The lower protective film 400 may prevent the rear surface of the display panel 100 from being scratched during a manufacturing process of the display panel 100. The lower protective film 400 may be a polyimide ("PI") film, or a polyethylene terephthalate ("PET") film. The lower protective film 400 may be a colored film. In one embodiment, for example, the lower protective film 400 may be an opaque yellow film, but an embodiment of the invention is not limited thereto.

The thickness of the lower protective film 400 may be in a range of about 40 μm to about 80 μm, for example, about 50 μm. The thickness of the second intermediate adhesive layer 1020 may be in a range of about 15 μm to about 30 μm m, for example, about 25 μm. However, the thickness of the lower protective film 400 and the thickness of the second intermediate adhesive layer 1020 are not limited thereto.

The barrier member 500 may be disposed under the lower protective film 400. The barrier member 500 may include a barrier layer 520, an upper barrier adhesive layer 510, and a lower barrier adhesive layer 530.

The barrier layer 520 may increase resistance to compressive force caused by external pressing. Accordingly, the barrier layer 520 may function to prevent deformation of the display panel DP. The barrier layer 520 may include a flexible plastic material such as polyimide or polyethylene terephthalate.

The barrier layer 520 may have a color that absorbs light. In an embodiment, the barrier layer 520 may have a black color. In such an embodiment, when the display panel 100 is seen from above the display panel 100, components disposed under the barrier layer 520 may not be viewed.

The barrier layer 520 may be connected to the rear surface of the lower protective film 400 by the upper barrier adhesive layer 510. The barrier layer 520 may be connected to the upper surface of the first plate 600 by the lower barrier adhesive layer 530. The upper barrier adhesive layer 510 and the lower barrier adhesive layer 530 may each include a transparent adhesive such as a PSA, an OCA, and an OCR, but the type of an adhesive is not limited thereto.

In an embodiment, the lower barrier adhesive layer 530 may not be disposed in a region of the first plate 600 in which a plurality of openings 611 are defined. In such an embodiment, the lower barrier adhesive layer 530 may include a portion overlapping the first region 1000A1 and a portion overlapping the third region 1000A3, and have a shape in which the portions are spaced apart from each other with an opening 611-defined region therebetween. The lower barrier adhesive layer 530 may not be disposed in the second region 1000A2, but an embodiment of the invention is not limited thereto. The lower barrier adhesive layer 530 may be disposed in the second region 1000A2, or the lower barrier adhesive layer 530 may have an irregular shape in the upward direction not to be in contact with a portion in which the openings 611 are defined.

The thickness of the barrier layer 520 may be in a range of about 20 μm to about 50 μm, for example, 35 μm. The thickness of the upper barrier adhesive layer 510 may be in a range of about 15 μm to about 30 μm, for example, about 25 μm. The thickness of the lower barrier adhesive layer 530 may be in a range of about 10 μm to about 20 μm, for example, about 16 μm. However, the thickness of the barrier layer 520, the thickness of the upper barrier adhesive layer 510, and the thickness of the lower barrier adhesive layer 530 are not limited thereto.

The first plate 600 may be disposed under the barrier member 500. The first plate 600 may include a material having an elastic modulus of about 60 GPa or more at room temperature. The first plate 600 may include metal. The first plate 600 may include a single metal material, or an alloy of a plurality of metal materials. In one embodiment, for example, the first plate 600 may include SUS304, but is not limited thereto, and may include various metal materials. The first plate 600 may be configured to support components disposed thereon, for example, the display panel 100, etc. In such an embodiment, the heat dissipation performance of the display device 1000 may be improved by the first plate 600.

The openings 611 may be defined in a portion of the first plate 600. The openings 611 may be defined in a region overlapping the second region 1000A2. When viewed from a plan view in the third direction DR3, the openings 611 may overlap the second region 1000A2. The shape of a portion of the first plate 600 may be deformed more easily due to the openings 611. FIG. 2A illustrates one embodiment where a plurality of openings 611 are defined in a portion of the first plate 600. However, an embodiment of the invention is not limited thereto, and the openings 611 may be defined in the form of a gap in the entire region overlapping the second region 1000A2.

The lower functional layer may further include a cover layer 900 disposed under the first plate 600. The cover layer 900 may be disposed directly under the first plate 600. Alternatively, the cover layer 900 may be attached under the first plate 600 by an adhesive layer. The cover layer 900 may cover the opening 611 of the first plate 600. Accordingly, introduction of foreign matters into the opening 611 may be additionally prevented.

The cover layer 900 may include a material having a lower elastic modulus than that of the first plate 600. The cover layer 900 may be a flexible film. The cover layer 900 may include a material having an elastic modulus of about 30 MPa or less and an elongation of about 100% or more. In one embodiment, for example, the cover layer 900 may include at least one of an acrylic resin, a methacrylic resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. In one embodiment, for example, the cover layer 900 may include thermoplastic polyurethane. The cover layer 900 may be a thermoplastic polyurethane film in which mesh patterns are formed. The cover layer 900 may be manufactured in the form of a sheet, and may be attached under the first plate 600.

The thickness of the first plate 600 may be about 120 μm to about 180 μm, for example, about 150 μm. The thickness of the cover layer 900 may be about 10 μm to about 20 μm, for example, about 16 μm. However, the thickness of the first plate 600 and the thickness of the cover layer 900 are not limited to the aforementioned numerical values.

The second plate 800 may be disposed under the first plate 600. The second plate 800 is provided in plurality. One of the plurality of second plates 800 may be disposed overlapping the first region 1000A1 and a portion of the second region 1000A2, and the other one of the plurality of second plates 800 may be disposed overlapping the other portion of the second region 1000A2, and the third region 1000A3.

The second plate 800 may include a first sub plate 801 and a second sub plate 802. The first sub plate 801 may be disposed overlapping the first region 1000A1 and a portion of the second region 1000A2, and the second sub plate 802 may be disposed overlapping the other portion of the second region 1000A2, and the third region 1000A3.

The first sub plate 801 and the second sub plate 802 may be disposed spaced apart from each other in the second region 1000A2. However, the first sub plate 801 and the second sub plate 802 may be disposed as close as possible to each other, thereby supporting a region in which the openings 611 of the first plate 600 are formed. In one embodiment, for example, the portions, overlapping the second region 1000A2, of the first sub plate 801 and the second sub plate 802 may prevent the deformation of the shape of a region, in which the openings 611 of the first plate 600 are defined, caused by a pressure applied from above.

By virtue of components disposed under the second plate 800, for example, components such as a set member, the second plate 800 may function to prevent the shape of components disposed on the second plate 800 from being deformed. In addition, the heat dissipation performance of the display device 1000 may be improved by the second plate 800.

The second plate 800 may include a metal alloy, for example, a copper alloy. However, a material constituting the second plate 800 is not limited thereto. The thickness of the second plate 800 may be about 30 μm to about 70 μm, for example, about 50 μm, but the thickness of the second plate 800 is not limited thereto.

The heat dissipation layer 700 may be disposed between the first plate 600 and the second plate 800. The heat dissipation layer 700 may be disposed under the cover layer 900. The heat dissipation layer 700 may be disposed between the cover layer 900 and the second plate 800.

A first adhesive layer 1100 may be disposed between the heat dissipation layer 700 and the first plate 600. A second adhesive layer 1200 may be disposed between the heat dissipation layer 700 and the second plate 800. The first adhesive layer 1100 may be disposed between the heat dissipation layer 700 and the cover layer 900. The first adhesive layer 1100 may be in contact with the lower surface of the cover layer 900, and may be in contact with the upper surface of the heat dissipation layer 700. The second adhesive layer 1200 may be in contact with the lower surface of the heat dissipation layer 700, and may be in contact with the upper surface of the second plate 800.

The heat dissipation layer 700 may perform a heat dissipation function. The heat dissipation layer 700 may be a thermal conductive layer having a high thermal conductivity. In one embodiment, for example, the heat dissipation layer 700 may include graphite, but the material of the heat dissipation layer 700 is not limited thereto. The heat dissipation layer 700 may perform a heat dissipation function together with the first plate 600 and the second plate 800, so that the heat dissipation performance of the display device 1000 may be further improved.

The heat dissipation layer 700 may overlap all of the first region 1000A1, the second region 1000A2, and the third region 1000A3. At least a portion of the heat dissipation layer 700 may overlap the second region 1000A2. Since the heat dissipation layer 700 may have an integrated shape overlapping all of the first region 1000A1, the second region 1000A2, and the third region 1000A3, the heat dissipation performance may be further improved. FIG. 2A illustrates one embodiment where the heat dissipation layer 700 is a single flat layer, but an embodiment of the invention is not limited thereto. The shape of the heat dissipation layer 700 may be changed to suitably perform a folding operation. In one embodiment, for example, a portion, overlapping the second region 1000A2, of the heat dissipation layer 700 may have a partially bent shape.

The thickness of the heat dissipation layer 700 may be in a range of about 20 μm to about 40 μm, for example, about 31 μm. The thickness of each of the first adhesive layer 1100 and the second adhesive layer 1200 may be in a range of about 1 μm to about 10 μm, for example, about 4 μm. However, the thickness of the heat dissipation layer 700, and the thickness of each of the first adhesive layer 1100 and the second adhesive layer 1200 are not limited the aforementioned numerical values.

The lower functional layer may further include a step compensation layer 1300 disposed under the first plate 600. The step compensation layer 1300 may be disposed under the cover layer 900. The step compensation layer 1300 may be disposed between the cover layer 900 and the second plate 800.

The step compensation layer 1300 may be disposed spaced apart from the heat dissipation layer 700 in the first direction DR1. The step compensation layer 1300 may be disposed around the border (or edges) of the heat dissipation layer 700, and around the border of each of the first adhesive layer 1100 and the second adhesive layer 1200. The step compensation layer 1300 may include a double-sided tape. The adhesive force of one surface of the step compensation layer 1300 may be weaker than that of the other surface of the step compensation layer 1300. In one embodiment, for example, one surface of the step compensation layer 1300 may not have an adhesive force.

The heat dissipation layer 700, the first adhesive layer 1100, and the second adhesive layer 1200 may be each disposed more inwards than the border of the cover layer 900 and the border of the second plate 800. The step compensation layer 1300 may be disposed in portions which are adjacent to the borders of the cover layer 900 and the second plate 800, and in which the heat dissipation layer 700, the first adhesive layer 1100 and the second adhesive layer 1200 are not disposed. The step compensation layer 1300 may compensate for the height difference of a portion in which the heat dissipation layer 700, the first adhesive layer 1100, and the second adhesive layer 1200 are not disposed. The thickness of the step compensation layer 1300 may be substantially the same as the sum of the thicknesses of the heat dissipation layer 700, the first adhesive layer 1100, and the second adhesive layer 1200. Meanwhile, in the specification, the wording of a thickness, a width, a gap, etc., being "substantially the same" may indicate not only a case that the thickness, the width, the gap, etc., are physically and completely the same, but also a case that they are the same in design but slightly different due to an error which may occur in the process.

Referring to FIG. 2B, in an alternative embodiment, a heat dissipation layer 700-1 included in a display device 1000-1 may include a first heat dissipation portion 711, a second heat dissipation portion 712, and a third heat dissipation portion 713. The first heat dissipation portion 711 may overlap the first region 1000A1, the second heat dissipation portion 712 may overlap the second region 1000A2, and the third heat dissipation portion 713 may overlap the third region 1000A3.

In an embodiment, as illustrated in FIG. 2B, a portion of the second heat dissipation portion 712 may have a bent shape. As the second heat dissipation portion 712 is bent, the bent portion may be disposed between the first sub plate 801 and the second sub plate 802. The bent portion of the second heat dissipation portion 712 may be thinner than the other portion. In an embodiment, the bent portion of the second heat dissipation portion 712 may be bent twice in the lower direction and in the left direction as illustrated in FIG. 2B, but the bent shape of the second heat dissipation portion 712 is not limited thereto. In a state in which the display device 1000-1 is unfolded, a portion of the second heat dissipation portion 712 may remain being bent. In a state in which the display device 1000-1 is folded, a portion of the second heat dissipation portion 712 may be in a stretched state. Since a portion of the second heat dissipation portion 712 may have a bent shape, the area of the heat dissipation layer 700-1 may increase to improve the heat dissipation performance, and also the damage of the second heat dissipation portion 712 due to a folding operation may be effectively prevented.

Figure 4A:
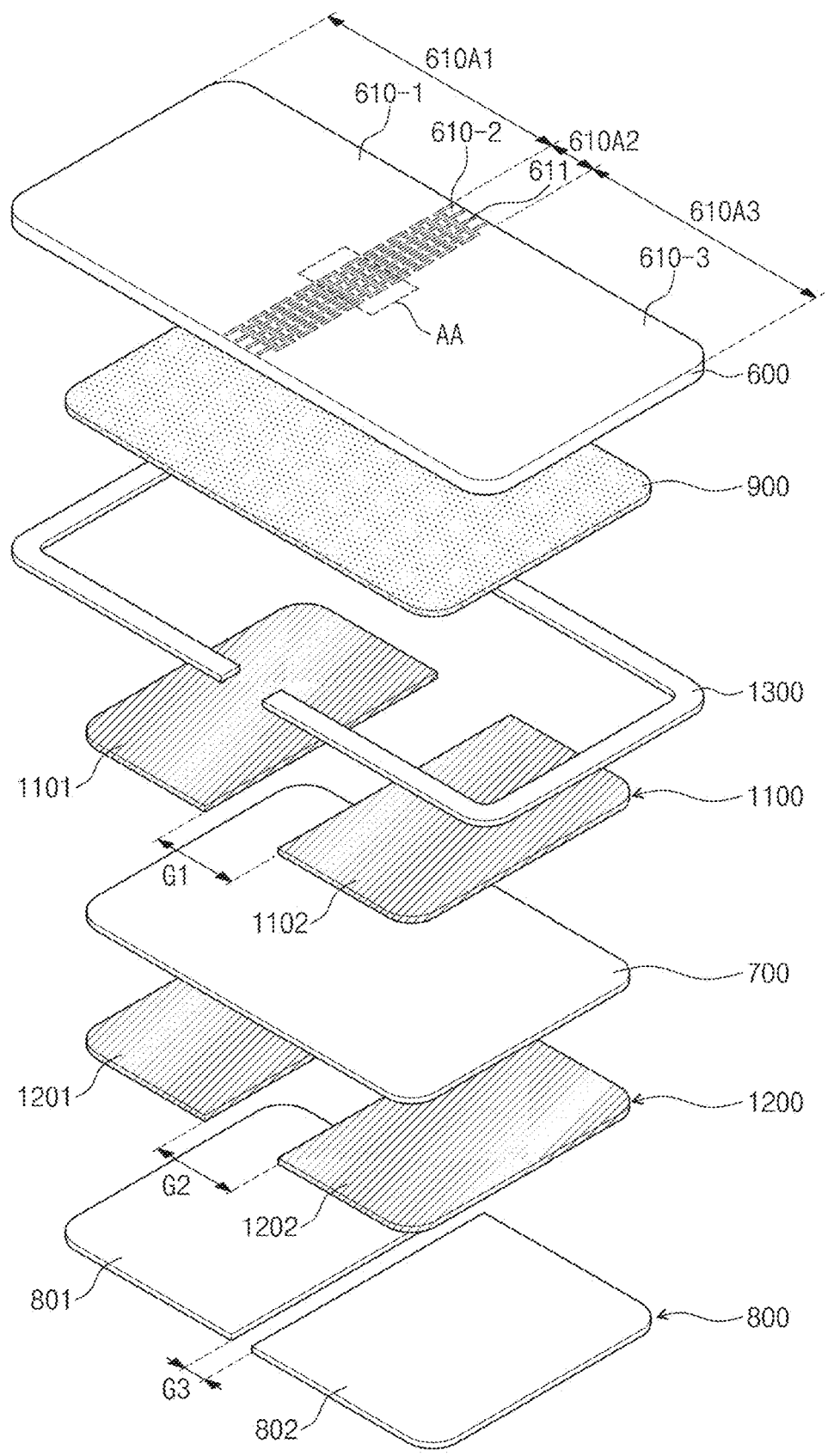
FIG. 4A is an exploded perspective view of a partial configuration included in a display device according to an embodiment of the invention.
Figure 4B:
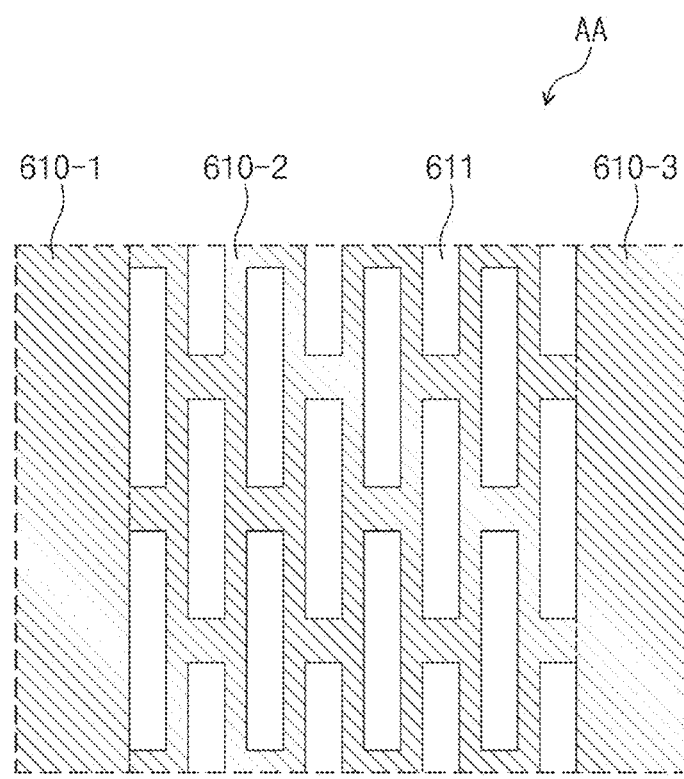
FIG. 4B is an enlarged plan view of a portion of a partial configuration included in a display device according to an embodiment of the invention.
Figure 4B:
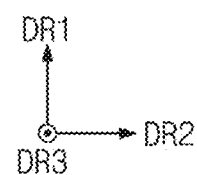
Figure 5A:
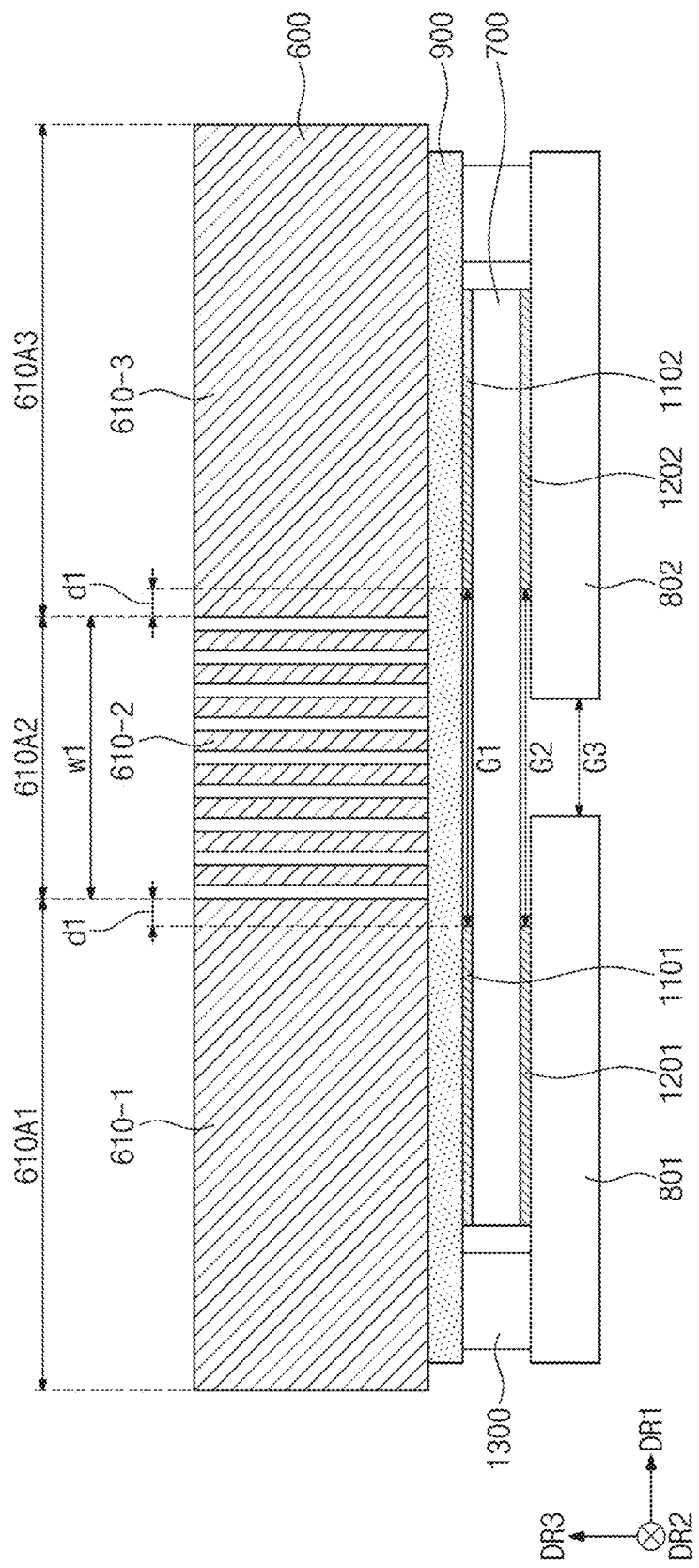
FIGS. 5A and 5B are cross-sectional views of a partial configuration included in a display device according to an embodiment of the invention.
Figure 5B:
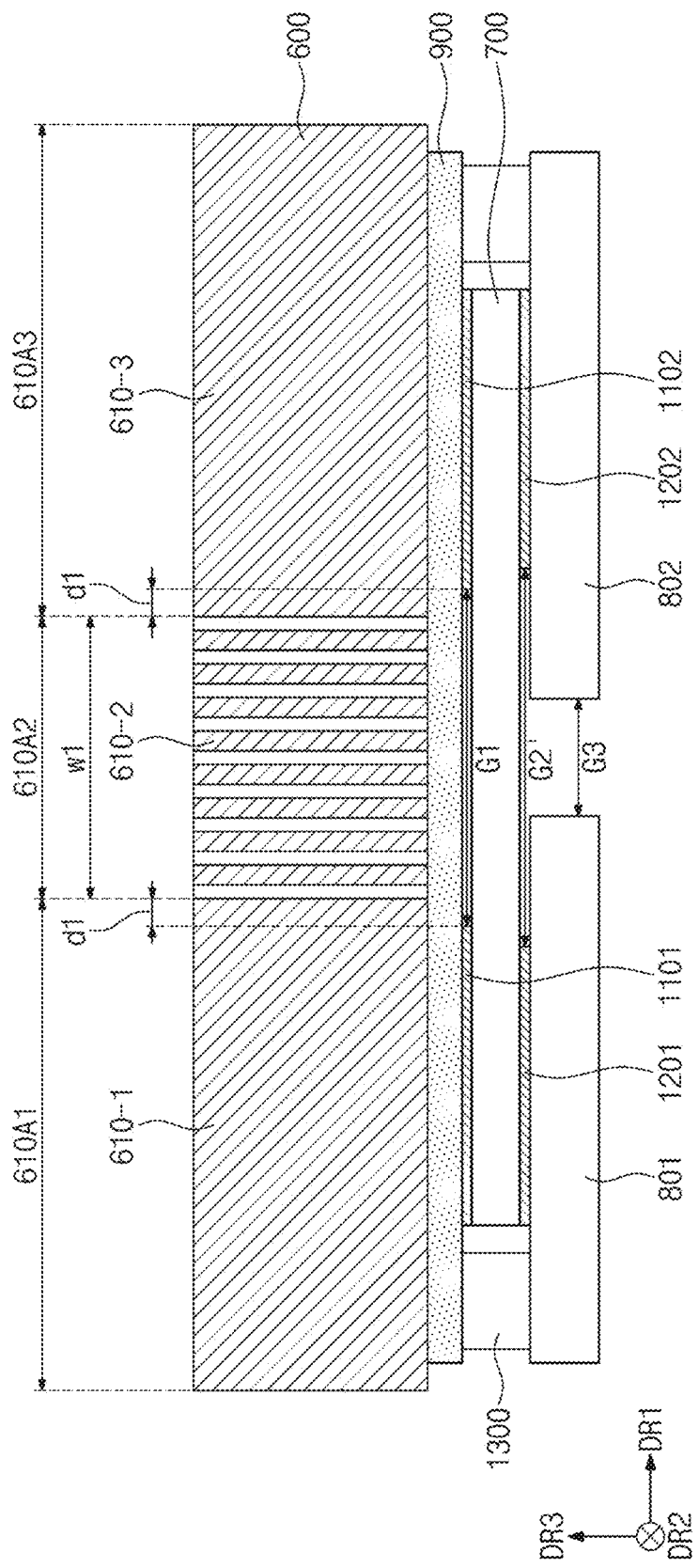

FIG. 4A is an exploded perspective view of a partial configuration included in a display device according to an embodiment of the invention. FIG. 4B is an enlarged plan view of a portion of a partial configuration included in a display device according to an embodiment of the invention. FIGS. 5A and 5B are cross-sectional views of a partial configuration included in a display device according to an embodiment of the invention. FIGS. 4A, 5A, and 5B illustrate a stacking relationship among a first plate 600, a cover layer 900, a step compensation layer 1300, a first adhesive layer 1100, a heat dissipation layer 700, a second adhesive layer 1200, and a second plate 800 which are included in lower functional layers of a display device according to an embodiment of the invention. FIG. 4B illustrates that a portion corresponding to region AA of FIG. 4A is enlarged.

Referring to FIGS. 2A and 4A, in an embodiment, the first plate 600 included in a display device may include a first non-folding region 610A1, a folding region 610A2, and a second non-folding region 610A3 which are arranged along the first direction DR1. The folding region 610A2 of the first plate 600 may overlap the second region 1000A2 of the active region 1000A of the display device 1000. At least a portion of the first non-folding region 610A1 of the first plate 600 may overlap the first region 1000A1 of the active region 1000A of the display device 1000, and at least a portion of the second non-folding region 610A3 may overlap the second region 1000A2 of the active region 1000A of the display device 1000. At least portions of the first non-folding region 610A1 and the second non-folding region 610A3 may overlap the peripheral region 1000NA of the display device 1000. The first plate 600 may include a first portion 610-1 overlapping the first non-folding region 610A1, a second portion 610-2 overlapping the folding region 610A2, and a third portion 610-3 overlapping the second non-folding region 610A3. The first portion 610-1 and the third portion 610-3 may be referred to as a plate non-folding portion or a flat portion. The second portion 610-2 may be referred to as a plate folding portion or a flat portion.

A plurality of openings 611 overlapping the folding region 610A2 may be defined in the first plate 600. The openings 611 may overlap the second region 1000A2 of the active region 1000A of the display device 1000. In an embodiment, as illustrated in FIG. 4B, the openings 611 may be provided in a plurality of rows. The openings 611 may be provided in a plurality of rows arranged alternately with each other (or in a zigzag form) to be offset from each other. FIGS. 2, 4A, and 4B illustrate embodiments where the plurality of openings 611 are defined in the folding region 610A2 of the first plate 600, but an embodiment of the invention is not limited thereto. In an alternative embodiment, one opening may be defined in the first plate 600 in the form of a gap in the entire region overlapping the second region 1000A2. In such an embodiment, the first plate 600 may include the first portion 610-1 corresponding to the first non-folding region 610A1, and the third portion 610-3 corresponding to the second non-folding region 610A3, and exclude the second portion 610-2 overlapping the folding region 610A2, so that the first portion 610-1 and the third portion 610-3 may be spaced apart by a predetermined gap.

The cover layer 900 may overlap at least the folding region 610A2 of the first plate 600 on a plane. The cover layer 900 may overlap the second portion 610-2 of the first plate 600 on a plane, thereby covering the plurality of openings 611 defined in the second portion 610-2. In such an embodiment, the cover layer 900 may prevent foreign matters from being introduced through the plurality of openings 611 defined in the first plate 600.

The first adhesive layer 1100 may include a plurality of sub adhesive layers disposed under the cover layer 900, and spaced apart from each other. A gap between the plurality of sub adhesive layers included in the first adhesive layer 1100 may overlap the folding region 610A2 of the first plate 600. In an embodiment, the first adhesive layer 1100 may include a first sub adhesive layer 1101 overlapping the first non-folding region 610A1, and a second sub adhesive layer 1102 overlapping the second non-folding region 610A3, and the first sub adhesive layer 1101 and the second sub adhesive layer 1102 may be spaced apart from each other in the first direction DR1 with a first gap G1 therebetween. The first gap G1 may be defined so that a portion thereof overlaps the folding region 610A2. The first gap G1 may be defined so that a portion thereof overlaps the first non-folding region 610A1 and the second non-folding region 610A3.

The heat dissipation layer 700 may be disposed under the first adhesive layer 1100, and at least a portion thereof may overlap the folding region 610A2 of the first plate 600. The heat dissipation layer 700 may have an integrated shape overlapping all of the first non-folding region 610A1, the folding region 610A2, and the second non-folding region 610A3. FIG. 4A illustrates one embodiment where the heat dissipation layer 700 has a rectangular plate shape with round corners, but an embodiment of the invention is not limited thereto. A portion, overlapping the folding region 610A2, of the heat dissipation layer 700 may have a shape to have a width that decreases along the second direction DR2.

The second adhesive layer 1200 may include a plurality of sub adhesive layers disposed under the heat dissipation layer 700, and spaced apart from each other. A gap between the plurality of sub adhesive layers included in the second adhesive layer 1200 may overlap the folding region 610A2 of the first plate 600. In an embodiment, the second adhesive layer 1200 may include a third sub adhesive layer 1201 overlapping the first non-folding region 610A1, and a fourth sub adhesive layer 1202 overlapping the second non-folding region 610A3, and the third sub adhesive layer 1201 and the fourth sub adhesive layer 1202 may be spaced apart from each other in the first direction DR1 with a second gap G2 therebetween. The second gap G2 may be defined so that a portion thereof overlaps the folding region 610A2. The second gap G2 may be defined so that a portion thereof overlaps the first non-folding region 610A1 and the second non-folding region 610A3.

The second plate 800 may be disposed under the second adhesive layer 1200, and may include a plurality of sub plates. The second plate 800 may include a first sub plate 801 and a second sub plate 802. The first sub plate 801 and the second sub plate 802 may be spaced apart from each other in the first direction DR1 with the third gap G3 therebetween. The third gap G3 may be defined overlapping the folding region 610A2.

Although not shown, at least one hole, which overlaps each of the first sensing region 100SA1, the second sensing region 100SA2, and the third sensing region 100SA3 in FIG. 1A, may be defined in each of the first plate 600 and the second plate 800. The at least one hole may be also defined in each of the cover layer 900 and the step compensation layer 1300. The at least one hole may be provided to overlap a plurality of regions among the first sensing region 100SA1, the second sensing region 100SA2, and the third sensing region 100SA3. The heat dissipation layer 700, the first adhesive layer 1100, and the second adhesive layer 1200 may not each overlap a portion in which the at least one hole is defined.

Although not shown, at least one opening may be defined in each of the first plate 600 and the second plate 800. The at least one opening may be also defined in each of the cover layer 900 and the step compensation layer 1300. The at least one opening may be provided so that a printed circuit board connected to the display panel 100 is bonded or grounded. Alternatively, the at least one opening may be provided so that a cell-identifying layer for checking a product identification number is disposed. The heat dissipation layer 700, the first adhesive layer 1100, and the second adhesive layer 1200 may not each overlap a portion in which the at least one opening is defined.

Referring to FIGS. 4A and 5A, a width (or a length in the first direction DR1) of a gap between the plurality of sub adhesive layers included in the first adhesive layer 1100 may be greater than the width of the second portion 610-2 of the first plate 600. in an embodiment, the first gap G1 defined between the first sub adhesive layer 1101 and the second sub adhesive layer 1102 may have a greater width than a first width w1, which is the width of the second portion 610-2.

In an embodiment, the first gap G1 has a width in a range of about 9 millimeters (mm) to about 12 mm. In one embodiment, for example, the width of the first gap G1 may be about 10.65 mm. Alternatively, the width of the first gap G1 may be about 9.65 mm. The first width w1 may have a width in a range of about 7 mm to about 9 mm. In one embodiment, for example, the first width w1 may be about 8.65 mm.

The first gap G1 may have a greater width than the first width w1, and a difference d1 between the width of the first gap G1 and the first width w1 may be in a range about 0.5 mm to about 3 mm. In such an embodiment, the first gap G1 may be greater than the first width w1 by a distance in a range of about 0.5 mm to about 3 mm. The first width w1 may have a width of about 75% to about 90% of the first gap G1 on the basis of 100% of the first gap G1.

A gap between the plurality of sub adhesive layers included in the second adhesive layer 1200 may be greater than the width of the second portion 610-2 of the first plate 600. In an embodiment, the second gap G2 defined between the third sub adhesive layer 1201 and the fourth sub adhesive layer 1202 may have a greater width than the first width w1, which is the width of the second portion 610-2. In an embodiment, the width of the second gap G2 may have a width of about 9 mm to about 12 mm. In one embodiment, for example, the width of the second gap G2 may be about 10.65 mm.

In an embodiment, as illustrated in FIG. 5A, the second gap G2 may substantially have the same width as the first gap G1. In one embodiment, for example, both the first gap G1 and the second gap G2 may have the same width of about 10.65 mm.

Alternatively, as illustrated in FIG. 5B, the width of a second gap G2' may have a greater width than the width of the first gap G1. In one embodiment, for example, the width of the first gap G1 may be about 10.65 mm, and the width of the second gap G2' may be about 11.65 mm.

A width of a gap between the plurality of sub plates included in the second plate 800 may be smaller than the width of the second portion 610-2 of the first plate 600. In an embodiment, the third gap G3 defined between the first sub plate 801 and the second sub plate 802 may have a smaller width than the first width w1, which is the width of the second portion 610-2. In an embodiment, the third gap G3 may have a width of about 3 mm or less. In one embodiment, for example, the width of the third gap G3 may be about 0.4 mm, about 1 mm, about 1.6 mm, or about 1.8 mm.

Figure 6A:
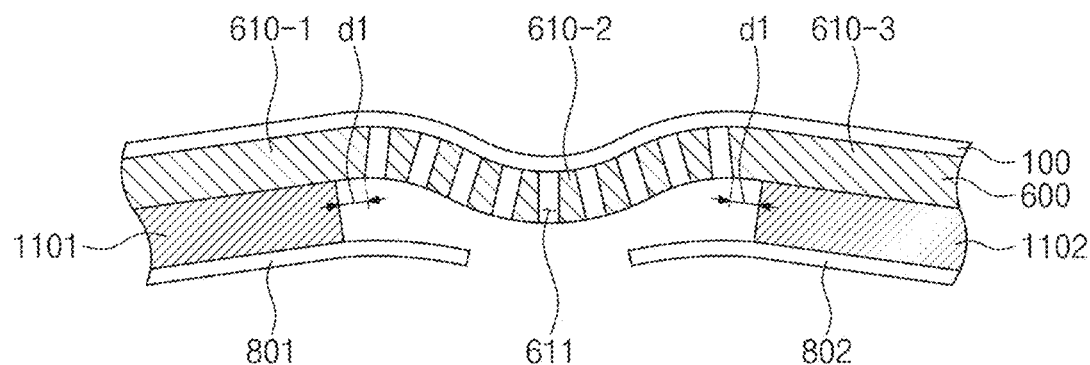
FIG. 6A is a cross-sectional view illustrating deformation due to the folding operation of a partial configuration of a display device according to an embodiment.
Figure 6B:
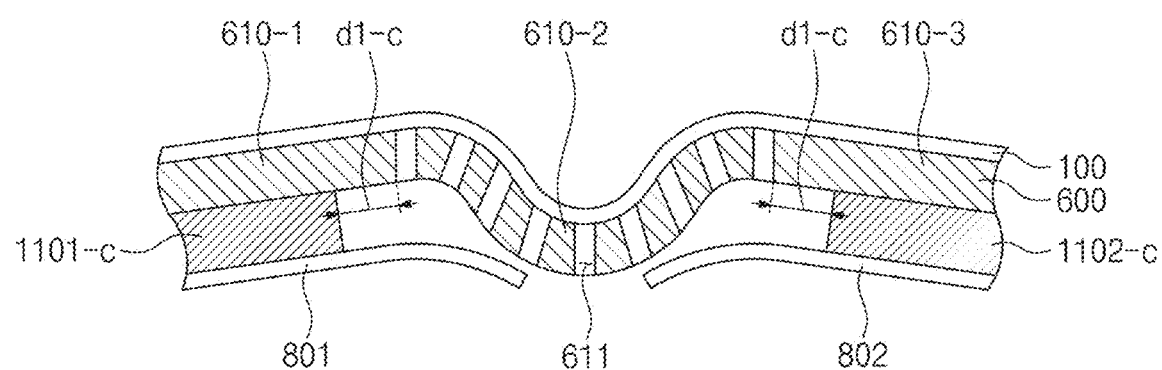
FIG. 6B is a cross-sectional view illustrating deformation due to the folding operation of a partial configuration of a display device according to Comparative Example.

FIG. 6A is a cross-sectional view illustrating a deformation due to the folding operation of a partial configuration of a display device according to an embodiment. FIG. 6B is a cross-sectional view illustrating a deformation due to the folding operation of a partial configuration of a display device according to Comparative Example. For convenience of description, FIG. 6A schematically illustrates only a configuration of a display panel 100, a first plate 600, a first adhesive layer 1100, and a second plate 800 in a display device according to an embodiment, and the other configuration is omitted. FIG. 6B illustrates a display device, of Comparative Example, including a configuration corresponding to the configuration illustrated in FIG. 6A.

As illustrated in FIGS. 5A and 6A, since the difference d1 between the first width w1, which is the width of the second portion 610-2 of the first plate 600, and the width of the first gap G1, which is the gap between a plurality of sub plates included in the first adhesive layer 1100 may be designed to be small, for example, to be in a range of about 0.5 mm to about 3 mm, in a display device according to an embodiment, a degree of the downward deformation of the second portion 610-2 due to a folding operation may be decreased. Accordingly, in such an embodiment, the amount of deformation due to a folding operation with respect to the display panel 100 disposed on the first plate 600 may be reduced, and the folding reliability of a display device including the display panel 100 may be improved. From simulation results of the display device according to an embodiment, it is shown that in a case where the first width w1 is in a range of about 8.65 mm, the first gap G1 is about 10.65 mm, and the difference d1 between the first width w1 and the width of the first gap G1 is about 2 mm, a degree of downward deformation of the central portion of the display panel 100 when the display device is restored to the original state after folded for 24 hours is different by about 78 μm from that of the outer portion thereof.

As illustrated in FIG. 6B, when a difference d1-c between a width of a gap between a first comparative sub adhesive layer 1101-c and a second comparative sub adhesive layer 1102-c, and a width of the second portion 610-2 is great, an effect that the first plate 600 is supported by the second plate 800 disposed thereunder may be reduced, and thus the second portion 610-2 may be greatly deformed downwards, thereby causing, the display panel 100 disposed on the first plate 600 to be greatly deformed downwards. From simulation results according to the display device of Comparative Example, it is shown that in a case where it is designed that the first width w1 is about 8.65 mm, the width of the first gap G1 is about 15.65 mm, and the difference d1-c between the first width w1 and the width of the first gap G1 is about 7 mm, a degree of downward deformation of the central portion of the display panel 100 when the display device is restored to the original state after folded for 24 hours, is different by about 111 μm from that of the outer portion thereof Consequently, it can be seen that the deformation amount in the display device according to Comparative Example is greater than that in the display device according to an embodiment.

When a display device performs repeated folding operations or folding operations for a long time, deformation due to the repulsive force of a material included in the display panel 100, etc., may occur in a portion overlapping a folding region. In particular, in a display device that performs an in-folding operation, deformation may occur in which the display panel 100 sags toward the lower surface opposing the upper surface in which a folding axis is defined. In an embodiment of a display device according to the invention in which the difference d1 between a width of a gap between the first sub adhesive layer 1101 and the second sub adhesive layer 1102, and the width of the second portion 610-2 is designed to be small, an effect that the first plate 600 is supported by the second plate 800 disposed thereunder may be improved, thereby reducing a degree of downward deformation of the second portion 610-2. Accordingly, in such an embodiment, the deformation amount of the display panel 100 disposed on the first plate 600 due to a folding operation may be reduced, and the folding characteristics of a display device including the display panel 100 may be improved.

According to embodiments of the invention, while multiple supporting plates disposed under a display panel are provided, a heat dissipation layer between the supporting plates are provided, and an adhesive region of an adhesive layer between the heat dissipation layer and the upper supporting plate is expanded, thereby improving a supporting effect. Accordingly, the folding characteristics of a display device may be improved, while ensuring the heat dissipation characteristics of the display device.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel including a first non-folding region, a folding region, and a second non-folding region, which are sequentially arranged along a first direction;
a first plate disposed under the display panel;
a heat dissipation layer disposed under the first plate; and
a first adhesive layer disposed between the first plate and the heat dissipation layer,
wherein the first adhesive layer includes a first sub adhesive layer overlapping the first non-folding region, and a second sub adhesive layer overlapping the second non-folding region,
the first sub adhesive layer and the second sub adhesive layer are spaced apart from each other in the first direction, and
a width of a first gap, by which the first sub adhesive layer and the second sub adhesive layer are spaced apart, in the first direction is in a range of about 9 mm to about 12 mm,
the first plate includes a plate-folding portion overlapping the folding region, and
a first width of the plate-folding portion in the first direction is smaller than the width of the first gap.

2. The display device of claim 1, further comprising:
a second plate disposed under the heat dissipation layer; and
a second adhesive layer disposed between the heat dissipation layer and the second plate.

3. The display device of claim 2, wherein
a plurality of openings are defined in the plate-folding portion.

4. The display device of claim 3, wherein the first width is smaller than the width of the first gap by a distance in a range of about 0.5 mm to about 3 mm.

5. The display device of claim 3, wherein the first width is in a range of about 7 mm to about 9 mm.

6. The display device of claim 3, further comprising:
a cover layer disposed between the first plate and the first adhesive layer,
wherein the cover layer covers the plurality of openings.

7. The display device of claim 6, further comprising:
a step compensation layer disposed between the cover layer and the second plate, and spaced apart from the heat dissipation layer in the first direction.

8. The display device of claim 2, wherein the second plate includes
a first sub plate overlapping the first non-folding region, and
a second sub plate overlapping the second non-folding region,
wherein the first sub plate and the second sub plate are spaced apart from each other in the first direction.

9. The display device of claim 8, wherein the second adhesive layer includes
a third sub adhesive layer disposed between the heat dissipation layer and the first sub plate, and
a fourth sub adhesive layer disposed between the heat dissipation layer and the second sub plate,
wherein the third sub adhesive layer and the fourth sub adhesive layer are spaced apart from each other by a second gap in the first direction.

10. The display device of claim 9, wherein a width of the second gap in the first direction is greater than the width of the first gap.

11. The display device of claim 9, wherein a width of the second gap in the first direction is substantially the same as the width of the first gap.

12. The display device of claim 8, wherein a width of a third gap between the first sub plate and the second sub plate in the first direction is smaller than the width of the first gap.

13. The display device of claim 2, wherein
the first adhesive layer is in contact with a lower surface of the first plate and an upper surface of the heat dissipation layer, and
the second adhesive layer is in contact with a lower surface of the heat dissipation layer and an upper surface of the second plate.

14. The display device of claim 1, further comprising:
an anti-reflective layer disposed on the display panel; and
a protective film disposed under the display panel.

15. The display device of claim 1, wherein the heat dissipation layer includes:
a first heat dissipation portion which overlaps the first non-folding region;
a second heat dissipation portion which overlaps the folding region, and of which a part is bent; and
a third heat dissipation portion which overlaps the second non-folding region.

16. A display device comprising:
a display panel including a first non-folding region, a folding region, and a second non-folding region, which are sequentially arranged along a first direction;
a first plate disposed under the display panel;
a heat dissipation layer disposed under the first plate; and
a first adhesive layer disposed between the first plate and the heat dissipation layer,
wherein the first adhesive layer includes a first sub adhesive layer overlapping the first non-folding region, and a second sub adhesive layer overlapping the second non-folding region,
the first plate includes a plate-folding portion in which a plurality of openings overlapping the folding region are defined,
the first sub adhesive layer and the second sub adhesive layer are spaced apart from each other by a first gap in the first direction, and
a first width of the plate-folding portion in the first direction is smaller than a width of the first gap in the first direction by a distance in a range of about 0.5 mm to about 3 mm.

17. The display device of claim 16, further comprising:
a second plate disposed under the heat dissipation layer; and
a second adhesive layer disposed between the heat dissipation layer and the second plate.

18. The display device of claim 17, wherein the second plate includes
a first sub plate overlapping the first non-folding region, and a second sub plate overlapping the second non-folding region, wherein the first sub plate and the second sub plate are spaced apart from each other in the first direction.

19. The display device of claim 18, wherein
the second adhesive layer includes a third sub adhesive layer disposed between the heat dissipation layer and the first sub plate, and a fourth sub adhesive layer disposed between the heat dissipation layer and the second sub plate,
the third sub adhesive layer and fourth sub adhesive layer are spaced apart from each other by a second gap in the first direction, and
the first width is smaller than a width of the second gap in the first direction by a distance in a range of about 0.5 mm to about 3 mm.

20. A display device comprising:
a display panel including a first non-folding region, a folding region, and a second non-folding region sequentially arranged along a first direction;
a first plate disposed under the display panel;
a heat dissipation layer disposed under the first plate; and
a first adhesive layer disposed between the first plate and the heat dissipation layer,
wherein the first adhesive layer includes a first sub adhesive layer overlapping the first non-folding region, and a second sub adhesive layer overlapping the second non-folding region,
the first plate includes a plate-folding portion in which a plurality of openings overlapping the folding region are defined,
the first sub adhesive layer and the second sub adhesive layer are spaced apart from each other by a first gap in the first direction, and
a first width of the plate-folding portion in the first direction is in a rage of about 75% to about 90% of a width of the first gap in the first direction.

\* \* \* \* \*